(12) United States Patent
Ozaki et al.

(10) Patent No.: US 8,390,099 B2
(45) Date of Patent: Mar. 5, 2013

(54) INTERCONNECTION SUBSTRATE HAVING FIRST AND SECOND INSULATING FILMS WITH AN ADHESION ENHANCING LAYER THEREBETWEEN

(75) Inventors: Shirou Ozaki, Kawasaki (JP); Yoshihiro Nakata, Kawasaki (JP); Tadahiro Imada, Kawasaki (JP); Yasushi Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 159 days.

(21) Appl. No.: 12/862,140

(22) Filed: Aug. 24, 2010

(65) Prior Publication Data

US 2010/0320618 A1   Dec. 23, 2010

Related U.S. Application Data

(63) Continuation of application No. PCT/JP2008/055390, filed on Mar. 24, 2008.

(51) Int. Cl.
 *H01L 23/58* (2006.01)
(52) U.S. Cl. .................. 257/642; 257/774; 438/479
(58) Field of Classification Search .................. 257/642, 257/774; 438/479
 See application file for complete search history.

(56) References Cited

U.S. PATENT DOCUMENTS

| | | | |
|---|---|---|---|
| 5,665,845 A * | 9/1997 | Allman | 528/8 |
| 7,147,900 B2 | 12/2006 | Tsuji et al. | |
| 7,728,065 B2 | 6/2010 | Ozaki et al. | |
| 2004/0180155 A1 * | 9/2004 | Nguyen-Misra et al. | 428/34 |
| 2004/0181007 A1 * | 9/2004 | Acevedo et al. | 524/589 |
| 2004/0248395 A1 | 12/2004 | Yoneda et al. | |
| 2005/0034667 A1 | 2/2005 | Tsuji et al. | |
| 2005/0113498 A1 * | 5/2005 | Auerbach | 524/262 |
| 2005/0170102 A1 | 8/2005 | Matsumoto et al. | |
| 2006/0211235 A1 | 9/2006 | Usami | |
| 2007/0077779 A1 * | 4/2007 | Rantala et al. | 438/778 |
| 2007/0111539 A1 | 5/2007 | Kon et al. | |
| 2007/0190461 A1 | 8/2007 | Ozaki et al. | |
| 2008/0026157 A1 * | 1/2008 | Jung et al. | 427/409 |
| 2010/0176496 A1 | 7/2010 | Ozaki et al. | |

FOREIGN PATENT DOCUMENTS

| | | |
|---|---|---|
| JP | 2000-232100 A | 8/2000 |
| JP | 2001-164184 A | 6/2001 |
| JP | 2003-518191 A | 6/2003 |
| JP | 2004-247695 A | 9/2004 |
| JP | 2005-019977 A | 1/2005 |
| JP | 2005-064516 A | 3/2005 |
| JP | 2005-217142 A | 8/2005 |
| JP | 3781730 B2 | 5/2006 |
| JP | 2006-261440 A | 9/2006 |
| JP | 2006-351877 A | 12/2006 |
| JP | 2007-141875 A | 6/2007 |
| JP | 2007-220750 A | 8/2007 |
| WO | 2001/046963 A1 | 6/2001 |

OTHER PUBLICATIONS

International Search Report of PCT/JP2008/055390, mailing date of May 27, 2008.

* cited by examiner

*Primary Examiner* — Thanh V Pham
(74) *Attorney, Agent, or Firm* — Westerman, Hattori, Daniels & Adrian, LLP

(57) ABSTRACT

An interconnection substrate including: a first insulating film made of a silicon compound, an adhesion enhancing layer formed on the first insulating film, and a second insulting film made of a silicon compound and formed on the adhesion enhancing layer, wherein the first insulating film and the second insulating film are combined together with a component having a structure represented by General Formula (1) described below:

$$\text{Si}-\text{C}_x\text{H}_y-\text{Si} \qquad \text{General Formula (1)}$$

where y is equal to 2x and is an even integer.

10 Claims, 10 Drawing Sheets

INTERCONNECTION SUBSTRATE HAVING FIRST AND SECOND INSULATING FILMS WITH AN ADHESION ENHANCING LAYER THEREBETWEEN

CROSS-REFERENCE TO RELATED APPLICATIONS

This is a continuation application of PCT/JP2008/055390, filed on Mar. 24, 2008, the entire contents of which are incorporated herein by reference.

FIELD

The embodiments discussed herein relate to an interconnection substrate, a semiconductor device, and a production method of a semiconductor device, and more specifically, relate to an interconnection substrate and a semiconductor device which require high response speed, and a production method of the semiconductor device.

BACKGROUND

Multilayer interconnection structures for semiconductor device include a Cu interconnection (wiring) and interlayer insulating films. In the multilayer interconnections, a reduction in signal propagation speed is determined by the interconnection resistance and parasitic capacities between interconnections. In recent years, with increased packaging densities of semiconductor integrated circuits, interconnection width and interconnection pitch are becoming narrower, causing an increase in interconnection resistance and an increase in parasitic capacities. The volume of insulating films can be reduced by reducing the wiring thickness so as to reduce the cross-section area thereof. However, a reduction in wiring thickness causes a further increase in interconnection resistance, making it impossible to increase the response speed of semiconductor devices. Therefore, a reduction in electrical resistance of interconnections and a reduction in dielectric constant of insulating films are effective to achieve the increase in response speed. Further, it is expected that the reduction in electrical resistance of interconnections and reduction in dielectric constant of insulating films will be major factors that control the performance of semiconductor devices. However, when the amount of organic groups is increased to make insulating films have low dielectric constant, insulating films are hydrophobized, causing a decrease in adhesion of the insulating films.

As described above, when the adhesion between laminated insulating films decreases, film rupture occurs among these films, resulting in a reduction in yield and a decrease in reliability. To avoid this problem, there have been studied materials for enhancing the adhesion and methods using plasma, and ozone. However, the problem has not yet been adequately solved.

As described above, when interlayer insulating films having low dielectric constant are used in a multilayer interconnection, it is important to improve the adhesion between these films.

In addition, the technique for irradiating an electron beam to insulating films is disclosed.

SUMMARY

The embodiment has been made to solve the above conventional problems and to achieve objects described below.

That is, an object of the embodiment is to provide an interconnection substrate capable of increasing the yield and reliability in a process of forming a multilayer interconnection for semiconductor device, and to provide a semiconductor device and a production method of a semiconductor device.

Means to solve the above-mentioned problems are as follows.

According to an aspect of the invention, an interconnection substrate includes a first insulating film made of a silicon compound, an adhesion enhancing layer formed on the first insulating film, and a second insulting film made of a silicon compound and formed on the adhesion enhancing layer, wherein the first insulating film and the second insulating film are combined together with a component having a structure represented by General Formula (1) described below:

   General Formula (1)

where y is equal to 2x and is an even integer.

In the interconnection substrate, the first insulating film and the second insulating film are combined together with the component having a structure represented by General Formula (1), and thus it is possible to increase the adhesion between insulating films and to increase the yield and reliability in a process of forming a multilayer interconnection for semiconductor device.

According another aspect of the invention, a semiconductor device includes a multilayer interconnection, wherein the multilayer interconnection comprises a first insulating film made of a silicon compound, an adhesion enhancing layer provided on the first insulating film, and a second insulting film made of a silicon compound and provided on the adhesion enhancing layer, and wherein the first insulating film and the second insulating film are combined together with a component having a structure represented by General Formula (1) described below:

   General Formula (1)

where y is equal to 2x and is an even integer.

In the semiconductor device, the first insulating film and the second insulating film are combined together with the component having a structure represented by General Formula (1), and thus it is possible to increase the adhesion between insulating films and to increase the yield and reliability in a process of forming a multilayer interconnection for semiconductor device.

According to still another aspect of the invention, a method for producing a semiconductor device, includes forming a multilayer interconnection, wherein the forming a multilayer interconnection includes: forming a first insulating film made of a silicone compound; forming, on the first insulating film, an adhesion enhancing layer containing a material reactive with an active energy beam; forming, on the adhesion enhancing layer, a second insulating film made of a silicon compound through which the active energy ray can pass, so as to form a laminate of the first insulating film, the adhesion enhancing layer and the second insulating film; and irradiating the active energy beam to the laminate from the side of the second insulating film so that a component having a structure represented by General Formula (1) described below is formed between the first insulating film and the second insulating film:

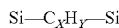   General Formula (1)

where y is equal to 2x and is an even integer.

In the method for producing a semiconductor device, a first insulating film made of a silicon compound is formed; an adhesion enhancing layer containing a material reactive with an active energy beam is formed on the first insulating film; a second insulating film made of a silicon compound through which the active energy ray can pass is formed on the adhesion enhancing layer, so as to form a laminate of the first insulating film, the adhesion enhancing layer and the second insulating film; and the active energy beam is irradiated to the laminate from the side of the second insulating film, thereby a component having a structure represented by the following General Formula (1) is formed between the first insulating film and the second insulating film.

$$Si-C_XH_Y-Si \qquad \text{General Formula (1)}$$

where y is equal to 2x and is an even integer.

According to the embodiment, it is possible to solve the conventional problems and to achieve the above-mentioned object.

According to the embodiment, it is possible to provide an interconnection substrate having improvements in yield and adhesion strength and capable of increasing the yield and reliability in a process of forming a multilayer interconnection for semiconductor device, a semiconductor device and a method for producing a semiconductor device.

DESCRIPTION OF EMBODIMENTS (Interconnection Substrate) An interconnection substrate according to the present embodiment includes a first insulating film (1 in FIGS. 1A and 1B), an adhesion enhancing layer (2 in FIGS. 1A and 1B), and a second insulating film (3 in FIGS. 1A and 1B), and further includes other layers (4 in FIG. 1B), as required.

<Binding of First Insulating Film and Second Insulating Film> The first insulating film and the second insulating film are combined together with a component having a structure represented by General Formula (1) described below:

$$Si-C_XH_Y-Si \qquad \text{General Formula (1)}$$

where X is equal to 2Y, and X is an integer of 1 or more.

Figure 1A:
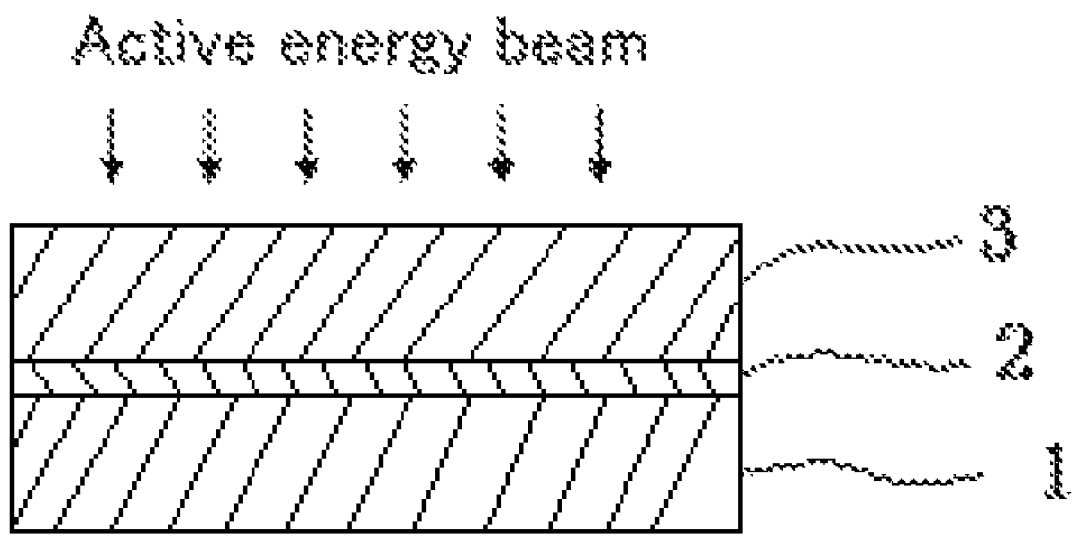
FIG. 1A illustrates an example of an interconnection substrate according to the embodiment (first).
Figure 1B:
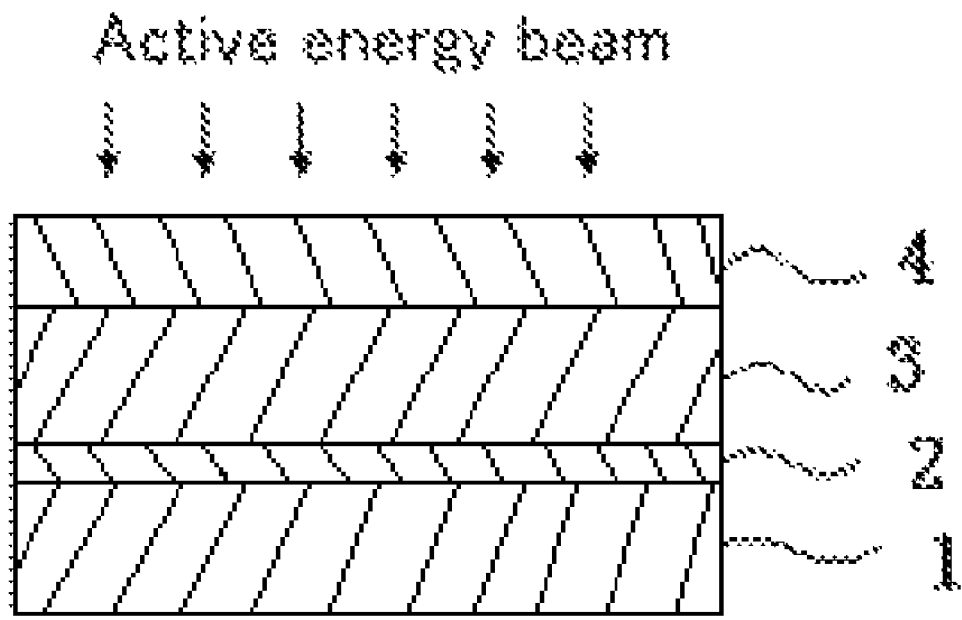
FIG. 1B illustrates another example of an interconnection substrate according to the embodiment (second).

The component having a structure represented by General Formula (1) is generated by forming the adhesion enhancing layer on the first insulating film, forming the second insulting film on the adhesion enhancing layer, and irradiating the second insulating film with an active energy ray from above (see FIGS. 1A and 1B). That is, Si—$C_XH_Y$ formed at interfaces between the adhesion enhancing layer and the first and second insulating films is caused to react with an active energy beam, whereby radical polymerization (the following Reaction Formula (1)) proceeds by abstraction of H atoms.

$$2Si-CH_3 \rightarrow Si-C_XH_Y-Si+H_2 \qquad \text{Reaction Formula (1)}$$

In addition, the adhesion enhancing layer preferably contains the component having a structure represented by General Formula (1) in an amount more than contained in the second insulating film. It is more preferable that a ratio A/B of a proportion (A) of the component having a structure represented by Si—$C_XH_Y$—Si to a proportion (B) of the component having a structure represented by Si—$C_XH_Y$—Si in the adhesion layer be 1.1 or more.

Meanwhile, when Si—OH is formed at the interfaces between the adhesion enhancing layer and the first and second insulating films, the Si—OH is caused to react with an active energy beam, whereby radical polymerization (the following Reaction Formula (2)) proceeds by abstraction of H atoms.

$$2Si-OH \rightarrow Si-O-Si+H_2O \qquad \text{Reaction Formula (2)}$$

Note that Si—OH present at the interface between the first insulating film and the second insulating film is formed by irradiating with at least one of ozone, active oxygen, plasma, ultraviolet ray, electron beam, X-ray. By forming the Si—OH, the interface between the first and second insulating films is hydrophilicated.

The presence of the component having a structure represented by Si—$C_XH_Y$—Si and the component having a structure represented by Si—O—Si can be detected by FT-IR or XPS.

<Distinguishing adhesion enhancing layer from first and second insulating films> The adhesion enhancing layer was distinguished from the first insulating film (lower layer) and the second insulating film (upper layer) by compositional analysis using an X-ray photoelectron spectrometer (AXIS-HSi, Kratos Analytical Ltd.). In the course of obtaining a composition distribution from a surface of the second insulating film in the depth direction thereof (toward the first insulating film), the region from a measurement point where the compositional percentage of carbon atoms is increased by 4% to the region reaching the first insulating film (lower layer) was determined as the adhesion enhancing layer.

<First Insulating Film> The first insulating film is not particularly limited as long as it is made of a silicon compound, and may be suitably selected in accordance with the intended use. Examples of the first insulating film include an $SiO_2$ film, an SiN film, an SiC film, an SiOC film, and an SiCN film each containing at least one selected from carbon, oxygen, nitrogen, hydrogen, etc., besides silicon.

<Adhesion Enhancing Layer> The adhesion enhancing layer is not particularly limited as long as it is formed on the first insulating film, and may be suitably selected in accordance with the intended use. The material forming the adhesion enhancing layer is preferably a material reactive with an active energy beam such as infrared ray, visible light, ultraviolet ray, electron beam and X-ray. Preferred examples of the material include a material containing organoalkoxysilane reactive with an active energy beam, and a material containing a basic additive and organoalkoxysilane.

<<Organoalkoxysilane reactive with active energy beam>> The organoalkoxysilane reactive with an active energy beam is not particularly limited and may be suitably selected in accordance with the intended use. Examples thereof include vinyltriacetoxysilane, vinyltris(methoxyethoxy)silane, and 3-phenylaminopropyltrimethoxysilane.

Among these, a vinylalkoxysilane compound having an unsaturated bond is particularly preferable.

<<Basic Additive>> The basic additive is not particularly limited, as long as it can impart basicity to, for example, organoalkoxysilane, and may be suitably selected in accordance with the intended use. However, additive a nitrogen-containing basic functional group is preferable in that it has high affinity with organoalkoxysilane.

The additive a nitrogen-containing basic functional group is not particularly limited and may be suitably selected in accordance with the intended use. Examples thereof include 1,2-ethanediamine, and N-{(ethenylphenyl)methyl.

<<Organoalkoxysilane>> The organoalkoxysilane added together with the basic additive to the adhesion enhancing layer is not particularly limited and may be suitably selected in accordance with the intended use. Examples thereof include N-{3-(trimethoxysilyl)propyl}.

<Second insulating Film> The second insulating film is not particularly limited, as long as it is made of a silicon compound and formed on the adhesion enhancing layer, and may be suitably selected in accordance with the intended use. Examples thereof include porous films such as an $SiO_2$ film, an SiN film, an SiC film, an SiOC film, and an SiCN film each containing at least one selected from carbon, oxygen, nitrogen, hydrogen, etc., besides silicon.

<Other Layers> The other layers are not particularly limited, as long as these layers do not impair the effects of the embodiment, and may be suitably selected in accordance with the intended use.

(Semiconductor Device) A semiconductor device according to the present embodiment includes a multilayer interconnection and further includes other members as required.

<Multilayer Interconnection> The multilayer interconnection includes the first insulating film, the adhesion enhancing layer, and the second insulating film, and further includes other layers as required.

<<First Insulating Film>> The first insulating film is not particularly limited, as long as it is made of a silicon compound, and may be suitably selected in accordance with the intended use. Examples of the first insulating film include an $SiO_2$ film, an SiN film, an SiC film, an SiOC film, and an SiCN film each containing at least one selected from carbon, oxygen, nitrogen, hydrogen, etc., besides silicon.

<<Adhesion Enhancing Layer>> The adhesion enhancing layer is not particularly limited, as long as it is formed on the first insulating film, and may be suitably selected in accordance with the intended use. The material forming the adhesion enhancing layer is preferably a material reactive with an active energy beam such as infrared ray, visible light, ultraviolet ray, electron beam and X-ray. Preferred examples of the material include a material containing organoalkoxysilane reactive with an active energy beam, and a material containing a basic additive and organoalkoxysilane.

<<Second Insulating Film>> The second insulating film is not particularly limited, as long as it is made of a silicon compound and formed on the adhesion enhancing layer, and may be suitably selected in accordance with the intended use. Examples of the second insulating film include porous films such as an $SiO_2$ film, an SiN film, an SiC film, an SiOC film, and an SiCN film each containing at least one selected from carbon, oxygen, nitrogen, hydrogen, etc., besides silicon.

<<Other Layers>> The other layers are not particularly limited, as long as these layers do not impair the effects of the embodiment, and may be suitably selected in accordance with the intended use. For example, an interconnection layer, interlayer insulating films other than the first insulating film, the adhesion enhancing layer and the second insulating film are exemplified.

<<<Interconnection Layer>>> The material, structure, and the thickness of the interconnection layer are not particularly limited and may be suitably selected in accordance with the intended use. The structure is, however, preferably a laminate structure (multilayer structure) from the viewpoint of improving the degree of integration of a circuit.

<<<Interlayer Insulating Film>>> The interlayer insulating film is not particularly limited, and may be suitably selected in accordance with the intended use. For example, a stopper film is exemplified. Specific examples of the inter layer insulating film include Carbon Doped films formed by a plasma CVD method (e.g. $SiO_2$ film, SiC:H film, SiC:N film, SiC:O:H film, and $SiO_2$ film), and organic SOG and inorganic SOG films formed by spin-coating. Among these films, when the second insulating film (porous film) is formed by spin-coating, the organic SOG and inorganic SOG films are preferably used as the interlayer insulating film. In this case, forming of the second insulating film (porous film) and the interlayer insulating film, and curing with ultraviolet irradiation (ultraviolet ray curing) can be performed at a time, making it possible to simplify the production process.

The material, shape, structure, thickness, and density of the interlayer insulating film are not particularly limited and may be suitably selected in accordance with the intended use. The thickness is, however, preferably 5 nm to 300 nm, and more preferably 5 nm to 180 nm.

When the thickness of the interlayer insulating film is less than 5 nm, the exposure to light irradiation may cause large damage to the interlayer insulating film. When the thickness is more than 300 nm, a difference in degree of curing progress may occur between upper and lower portions of the film.

Meanwhile, the density of the interlayer insulating film is preferably 1 $g/cm^3$ to 3 $g/cm^3$, and more preferably 1 $g/cm^3$ to 2.5 $g/cm^3$.

When the density is less than 1 $g/cm^3$, the film strength may decrease significantly. When it is more than 3 $g/cm^3$, it may be difficult to keep the dielectric constant of the interlayer insulating film low.

<Other Members> The other members are not particularly limited and may be suitably selected in accordance with the intended use. For example, components generally used for various semiconductor devices, such as gate electrodes, drain electrodes, and source electrodes, are exemplified.

(Method for Producing Semiconductor Device) The method for producing a semiconductor device includes at least forming a multilayer interconnection, in which the above-mentioned multilayer interconnection is formed.

<Multilayer Interconnection Forming Step> The multilayer interconnection forming step is a step of forming the multilayer interconnection.

The multilayer interconnection forming step include at least a first insulating film forming step, an adhesion enhancing layer forming step, a second insulating film forming step, and an active-energy beam irradiating step, and further includes suitably selected steps as required.

<<First Insulating Film Forming Step>> The first insulating film forming step is a step of forming a first insulating film. Specifically, a coating liquid containing the silicon compound is spin-coated on a subject at 2,000 rpm, and then pre-baked at 150° C., 250° C. and 350° C., respectively, for 1 minute so as to volatilize solvents such as water and ethanol contained in the coating liquid, thereby forming a first insulating film. As to conditions for the spin-coating, for example, the number of revolutions is about 100 rpm to about 10,000 rpm, and more preferably 800 rpm to 5,000 rpm. The spin-coating time is about 1 second to about 10 minutes, and more preferably 10 seconds to 90 seconds. In the pre-baking, conditions such as temperature, atmosphere etc. can be suitably selected according to the purpose. The pre-baking temperature is preferably 50° C. to 350° C. In addition, the solvents are not particularly limited and may be suitably selected in accordance with the intended use. Examples of the solvents include cyclohexane, methylisobutylketone, methylethylketone, methyl cellosolve, ethyl cellosolve, octane, decane, propylene glycol, propylene glycol monomethyl ether, and propylene glycol monomethyl ether acetate.

The first insulating film is not particularly limited, as long as it is made of a silicon compound, and may be suitably selected in accordance with the intended use. Examples of the first insulating film include an $SiO_2$ film, an SiN film, an SiC film, an SiOC film, and an SiCN film each containing at least one selected from carbon, oxygen, nitrogen, hydrogen, etc., besides silicon.

<<Adhesion Enhancing Layer Forming Step>> The adhesion enhancing layer forming step is a step of forming an adhesion enhancing layer made of the material reactive with an active energy beam on the first insulating film. More specifically, a coating liquid containing the material reactive with an active energy beam is spin-coated on the first insulating film at 1,500 rpm, and the pre-baked at 150° C. for 1 minute so as to volatilize solvents such as water and ethanol contained in the coating liquid, thereby forming an adhesion enhancing layer. As to conditions for the spin-coating, for example, the number or revolutions is about 100 rpm to about 10,000 rpm, and more preferably 800 rpm to 5,000 rpm. The spin-coating time is about 1 second to about 10 minutes, and more preferably 10 seconds to 90 seconds. In the pre-baking, conditions such as temperature, atmosphere etc. can be suitably selected according to the purpose. The pre-baking temperature is preferably 50° C. to 350° C. In addition, the solvents are not particularly limited and may be suitably selected in accordance with the intended use. Examples of the solvents include cyclohexane, methylisobutylketone, methylethylketone, methyl cellosolve, ethyl cellosolve, octane, decane, propylene glycol, propylene glycol monomethyl ether, and propylene glycol monomethyl ether acetate.

The adhesion enhancing layer is not particularly limited, as long as it is formed on the first insulating film, and may be suitably selected in accordance with the intended use. The material forming the adhesion enhancing layer is preferably a material reactive with an active energy beam such as infrared ray, visible light, ultraviolet ray, electron beam and X-ray. Preferred examples of the material include a material containing organoalkoxysilane reactive with an active energy beam, and a material containing a basic additive and organoalkoxysilane.

<<Second Insulating Film Forming Stop>> The second insulating film forming step is a step of forming, on the adhesion enhancing layer, a second insulating film made of a silicon compound through which the active energy beam can pass. More specifically, a coating liquid containing a silicon compound through which the active energy beam can pass is spin-coated on the adhesion enhancing layer at 2,000 rpm, and then pre-baked at 150° C., 250° C. and 350° C., respectively, for 1 minute so as to volatilize solvents such as water and ethanol contained in the coating liquid, thereby forming a second insulating film. As to conditions for the spin-coating, for example, the number of revolutions is about 100 rpm to about 10,000 rpm, and more preferably 800 rpm to 5,000 rpm. The spin-coating time is about 1 second to about 10 minutes, and more preferably 10 seconds to 90 seconds. In the pre-baking, conditions such as temperature, atmosphere etc. can be suitably selected according to the purpose. The pre-baking temperature is preferably 50° C. to 350° C. In addition, the solvents are not particularly limited and may be suitably selected in accordance with the intended use. Examples of the solvents include cyclohexane, methylisobutylketone, methylethylketone, methyl cellosolve, ethyl cellosolve, octane, decane, propylene glycol, propylene glycol monomethyl ether, and propylene glycol monomethyl ether acetate.

The second insulating film is not particularly limited, as long as it is made of a silicon compound through which the active energy beam can pass, and may be suitably selected in accordance with the intended use. Examples thereof include porous films such as an $SiO_2$ film, an SiN film, an SiC film, an SiOC film, and an SiCN film each containing at least one selected from carbon, oxygen, nitrogen, hydrogen, etc., besides silicon.

<<Active Energy Beam Irradiating Step>> The active energy beam irradiating step is a step of irradiating the active energy beam to a laminate (stacked layers) from the side of the second insulating film to thereby form a component having a structure represented by the following General Formula (1) between the first insulating film and the second insulating film.

$$Si-C_XH_Y-Si \qquad \text{General Formula (1)}$$

where y is equal to 2x and is an even integer.

Here, the description "irradiating the active energy beam to a laminate (stacked layers) from the side of the second insulating film" encompasses that, as illustrated in FIG. 1B, the active energy beam is irradiated to not only via the second insulating film but also via the other layers than the second insulating film (e.g. other layer 4 in FIG. 1B).

Figure 3:
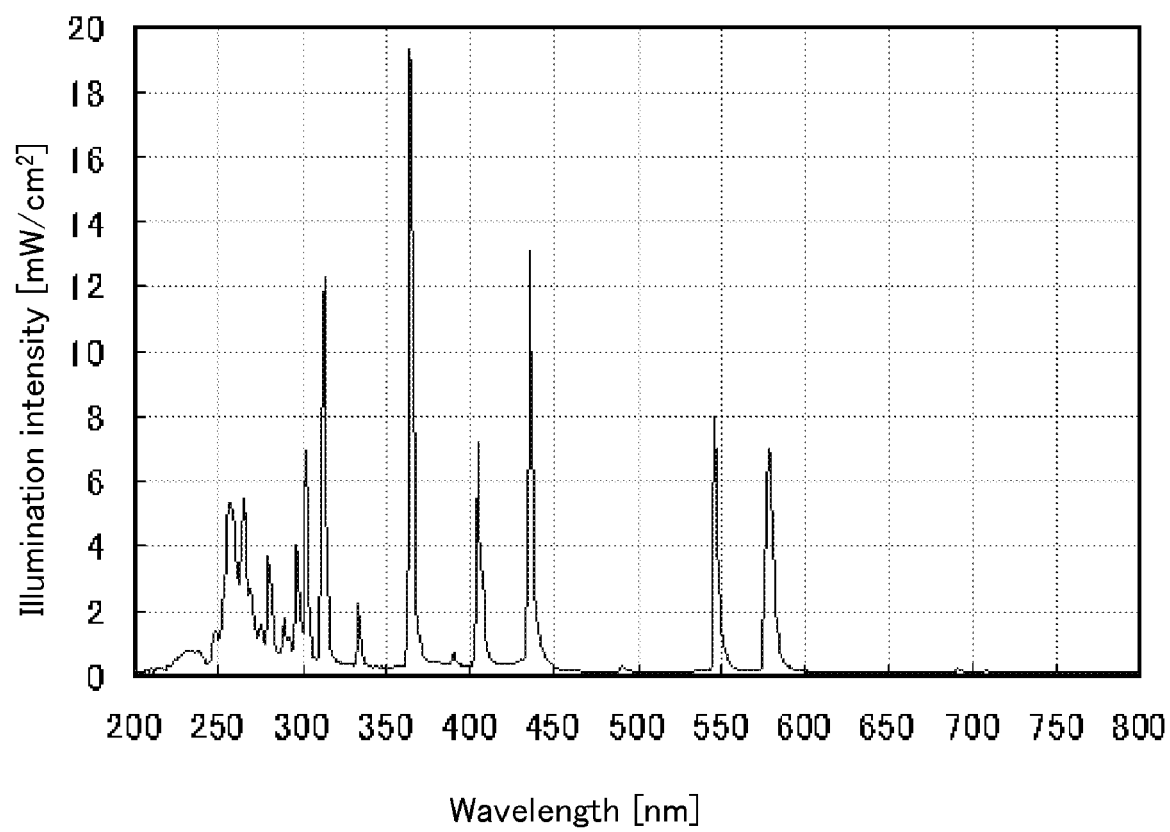
FIG. 3 illustrates a light emission spectrum of a high-pressure mercury lamp.

The active energy beam is at least one selected from the group consisting of infrared ray, visible light, ultraviolet ray, electron beam and X-ray. Among these, ultraviolet ray emitted from a high-pressure mercury lamp (UVL-7000H4-N, Ushio Inc.) having the light emission spectrum and illumination intensity as illustrated in FIG. 3 is preferable.

<<Other Steps>> The other steps are not particularly limited, as long as these layers do not impair the effects of the embodiment, and may be suitably selected in accordance with the intended use. Examples thereof include a heat treatment step in which the stacked layers are heated at 50° C. to 470° C. concurrently with the irradiation of active energy, and an irradiating step in which at least one of ozone, active oxygen, plasma, ultraviolet ray, electron beam, and X-ray is irradiated to the stacked layers so that Si—OH is formed at the interface between the first and second insulating films and hydrophilicated.

Hereinafter, the embodiment will be further described in detail by way of Examples and Comparative Example. However, these Examples shall not be construed as limiting the scope of the present invention.

—Preparation of First Insulating Film Forming Material— 10 g of polycarbosilane ("NIPSI-L; produced by Nippon Carbon Co., Ltd.; weight average molecular weight: approximately 400), 60 g (0.6 mol) of methylisobutylketone and 9 g (0.2 mol) of ethanol were charged in a reaction vessel, and 10 g of 60% by mass to 61% by mass of nitric acid water (0.1 mol in water) was dropped into the reaction vessel through a drop funnel at a drop rate of 2 mL/min at a constant temperature of 60° C. Upon completion of the dropping, the mixture was aged for 7 hours.

Next, using a separating funnel, the reaction product was dissolved in diethylether, and a large amount of water and sodium hydrogen carbonate were added to the reaction product. The reaction product was washed with water until the pH value became 5, to thereby remove excessive nitric acid. After the dropping, for the purpose of removing the water used for the removal of nitric acid, 200 mL of methylisobutylketone was added, and diethylether was removed by a rotary evaporator until the volume of the reaction solution became 100 mL, to thereby prepare a first insulating film material.

The prepared first insulating film forming material was found to have a solid content concentration of 15.6% by mass (weight average molecular weight of polycarbosilane resin: 400).

—Preparation of Second Insulating Film Forming Material— 20.8 g (0.1 mol) of tetraethoxysilane, 17.8 g (0.1 mol) of methyltriethoxysilane, 23.6 g (0.1 mol) of glycidoxypropyltrimethoxysilane, and 39.6 g methylisobutylketone were charged in a 200 mL reaction vessel, and 16.2 g (0.9 mol) of a 1% by mass tetramethylammonium hydroxide aqueous solution was dropped into the reaction vessel over 10 minutes. Upon completion of the dropping, the reaction product was aged for 2 hours.

Next, 5 g of magnesium sulfate was added to the reaction product to remove excessive moisture, and then ethanol generated through the aging reaction was removed by a rotary evaporator until the volume of the reaction solution became 50 mL.

Then, 20 mL of methylisobutylketone was added to the resulting reaction solution, followed by removing the methylisobutylketone with an oven heated at 200° C., to thereby prepare a second insulating film forming material.

The prepared second insulating film forming material was found to have a solid content concentration of 18.2% by mass (weight average molecular weight of siloxane resin: 172,000).

EXAMPLE 1

Figure 2A:
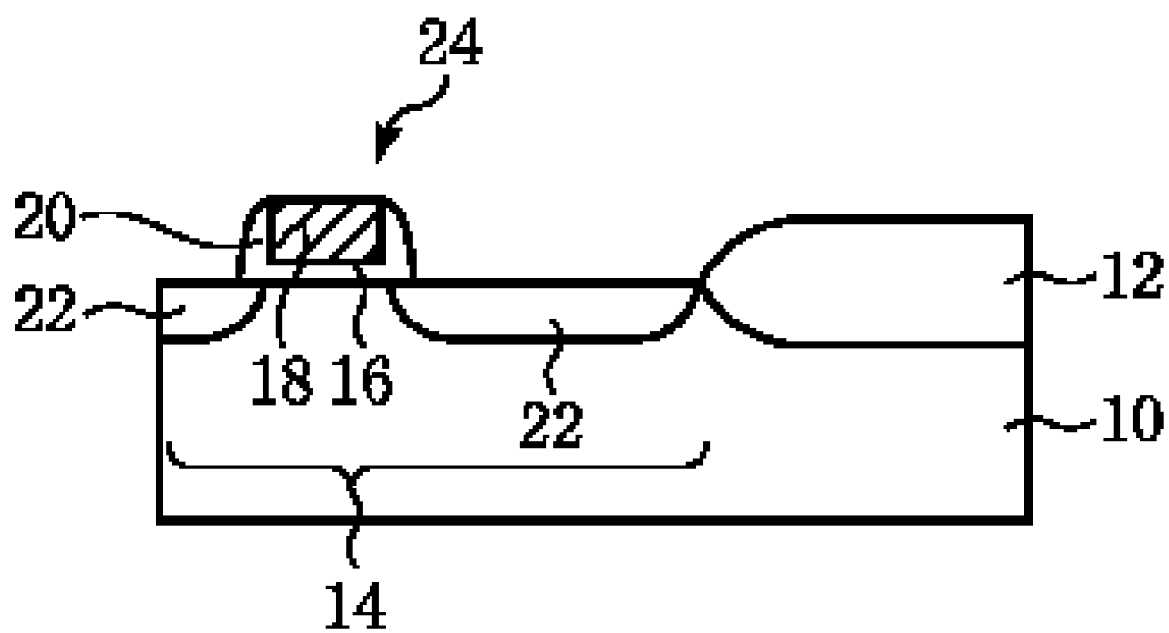
FIG. 2A exemplarily illustrate a step of a method for producing a semiconductor device according to the embodiment (first).

<Production of Multilayer Interconnection and Semiconductor Device> A multilayer interconnection and a semiconductor device according to the present embodiment were produced in the following manner. First, as illustrated in FIG. 2A, an element separation film 12 was formed on a semiconductor substrate 10 by a LOCOS (LOCal Oxidation of Silicon) method. An element region 14 was delimitated by the element separation film 12. Note that as the semiconductor substrate 10, a silicon substrate was used.

Next, on the element region 14, a gate electrode 18 was formed via a gate insulating film 16. Next, a side wall insulating film 20 were formed on both sides of the gate electrode 18. Further, source/drain diffusion layers 22 were formed in the semiconductor substrate 10 at both sides of the gate electrode 18 by introducing dopant impurities into the semiconductor substrate 10 using the side wall insulating film 20 and the gate electrode 18 as masks. As a result, a transistor 24 having the gate electrode 18 and the source/drain diffusion layers 22 was formed.

Figure 2B:
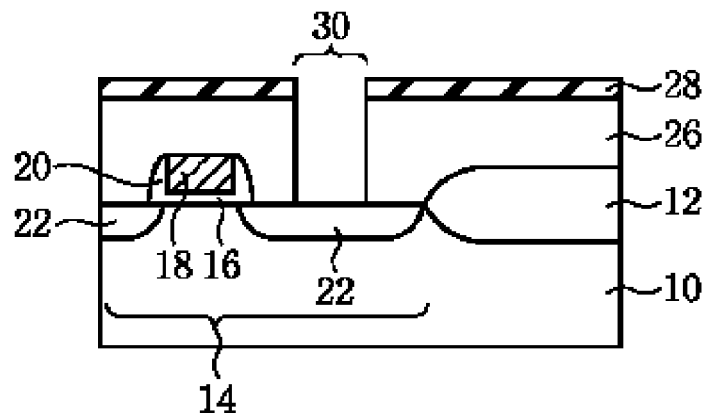
FIG. 2B exemplarily illustrates another step of a method for producing a semiconductor device according to the embodiment (second).

As illustrate in FIG. 2B, an interlayer insulating film 26 composed of a silicon oxide film was formed, by a CVD method, over the surface of the semiconductor substrate 10 with the transistor 24 formed on a surface thereof. Then, on the interlayer insulating film 26, a stopper film 28 composed of an SiN film (having a thickness of 50 nm) was formed by a plasma CVD method. Note that in the after-mentioned process, when a tungsten film 34 etc. is polished by chemical mechanical polishing (CMP), the stopper film 28 functions as a stopper (see FIG. 2C); and when a groove 46 is formed in a porous insulating film 38 etc., the stopper film 28 functions as an etching stopper (see FIG. 2F). Next, a contact hole 30 reaching the source/drain diffusion layer 22 was formed (see FIG. 2B).

Figure 2C:
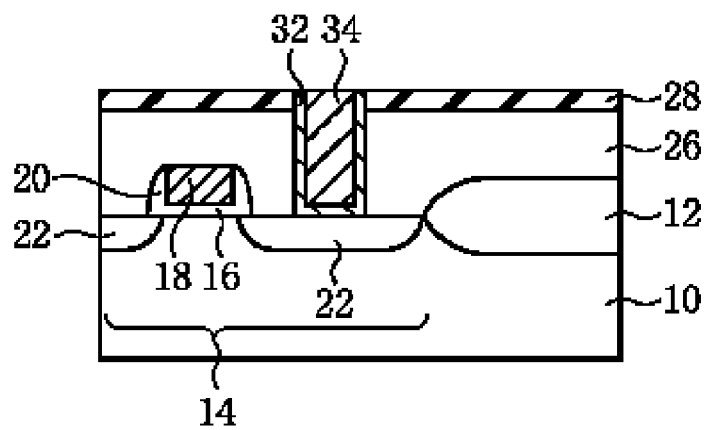
FIG. 2C exemplarily illustrates still another step of a method for producing a semiconductor device according to the embodiment (third).

Next, an adhesion enhancing layer 32 composed of a TiN film (having a thickness of 50 nm) was formed over the surface of the semiconductor substrate 10 by sputtering. Note that the adhesion of the after-mentioned conductive plug 34 to the base can be secured by the adhesion enhancing layer 32. Next, after the tungsten film 34 (having a thickness of 1 μm) was formed over the surface of the adhesion enhancing layer 32, the adhesion enhancing layer 32 and the tungsten film 34 were polished by chemical mechanical polishing (CMP) until the surface of the stopper film 28 was exposed. As a result, the conductive plug 34 made of tungsten was embedded in the contact hole 30, as illustrated in FIG. 2C.

Figure 2D:
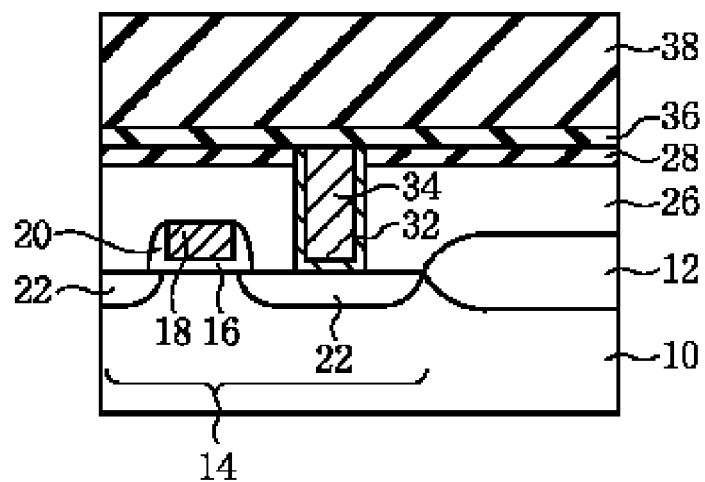
FIG. 2D exemplarily illustrates yet another step of a method for producing a semiconductor device according to the embodiment (fourth).

Next, the first insulating film forming material (coating liquid) was spin-coated on the surface of the substrate 10 and then pre-baked at 200° C. to volatilize the solvents contained in the coating liquid, thereby forming an interlayer insulating film (first insulating film) 36 (having a thickness of 50 nm) made of polycarbosilane (FIG. 2D).

Thereafter, a coating liquid containing 1% by mass of vinyltriacetoxysilane (SILA-ACE S200, produced by Chisso Corporation) was spin-coated over the interlayer insulating film 36 and then pre-baked at 100° C. to volatilize solvents contained in the coating liquid, thereby forming an adhesion enhancing layer (not illustrated) (adhesion enhancing layer forming treatment).

Further, the second insulating film forming material (coating liquid) was spin-coated over the adhesion enhancing layer, and pre-baked at 200° C. to volatilize the solvents contained in the coating liquid, thereby a porous insulating film (second insulating film) 38 made of a porous silica was formed so as to have a thickness of 160 nm. Then, an ultraviolet ray (active energy beam) having the light emission spectrum and illumination intensity illustrated in FIG. 3 was irradiated to the porous insulating film 38 at an illumination intensity of 250 mW/cm$^2$ (measured by UVD-S254, Ushio Inc.) for 10 minutes to thereby combine the interlayer insulating film 36 and the porous insulating film 38.

Figure 2E:
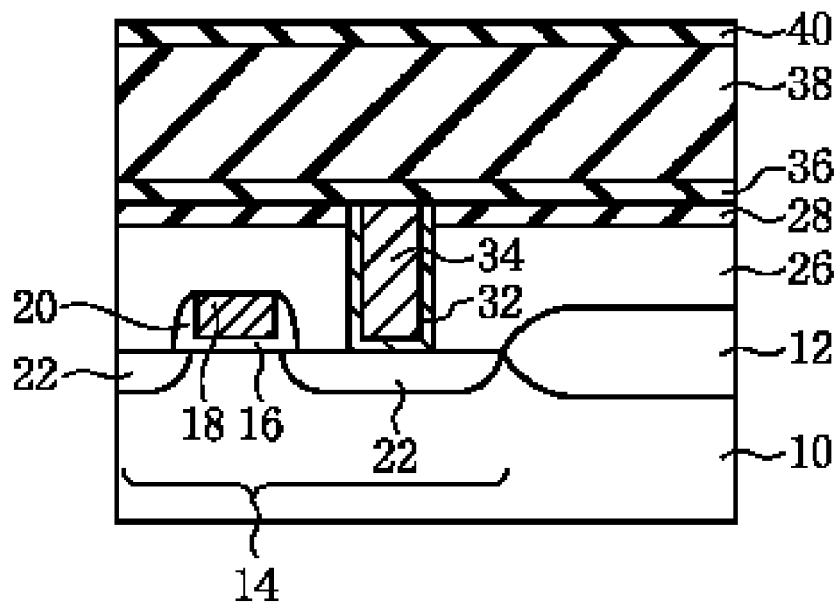
FIG. 2E exemplarily illustrates still yet another step of a method for producing a semiconductor device according to the embodiment (fifth).

Next, as illustrated in FIG. 2E, over the surface of the semiconductor substrate 10 having the porous insulating film 38 formed thereon, an interlayer insulating film 40 (having a thickness of 30 nm) was formed by a CVD method.

Figure 2F:
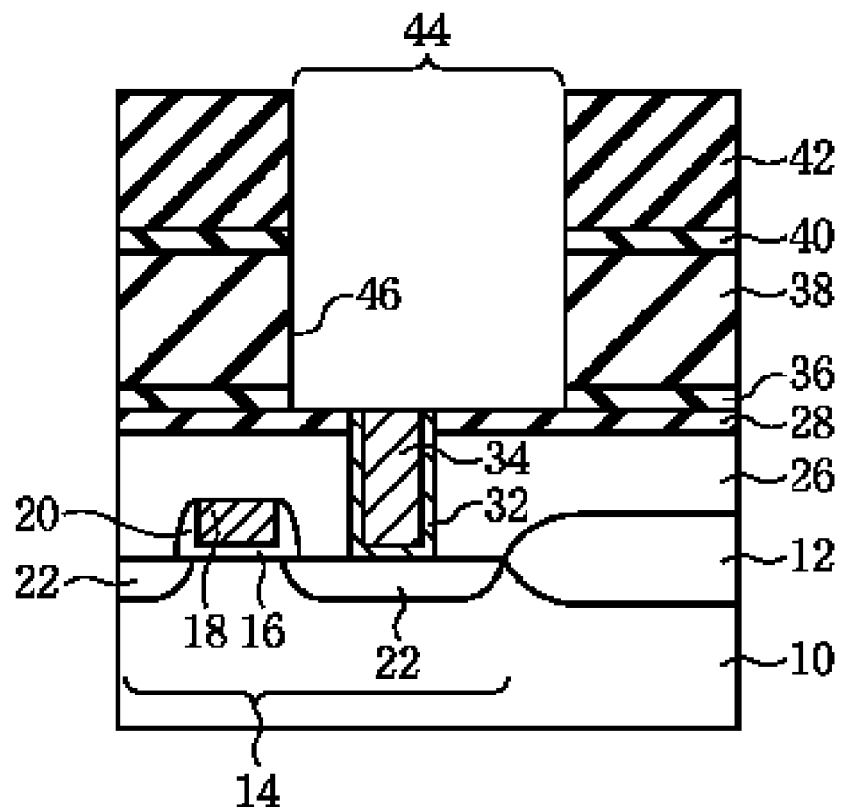
FIG. 2F exemplarily illustrates still yet another step of a method for producing a semiconductor device according to the embodiment (sixth).

Next, as illustrated in FIG. 2F, a photoresist film 42 was formed over the interlayer insulating film 40 by spin-coating. Then, an opening 44 was formed in the photoresist film 42 by photolithography. Here, the opening 44 is formed for forming the after-mentioned first interconnection (first metal interconnection layer) 50 (see FIG. 2G) and has such a size that the interconnection has a wiring width of 100 nm and a wiring pitch of 100 nm.

Then, the interlayer insulating film 40, porous insulating film 38, and interlayer insulating film 36 were subjected to etching treatment using the photoresist film 42 as a mask. Note that the etching treatment was carried out using a fluorine plasma containing $CF_4$ gas and $CHF_3$ gas as starting materials. In the etching, the stopper film 28 functioned as an etching stopper. In this way, a groove (trench) 46 for embedding an interconnection in the interlayer insulating film 40, porous insulating film 38 and interlayer insulating film 36 was formed. Note that the upper surface of the conductive plug 34 was exposed in the groove 46. Thereafter, the photoresist film 42 was stripped away from the workpiece.

Next, over the surface of the semiconductor substrate 10, a barrier film (not illustrated) made of TaN (having a thickness of 10 nm) was formed by sputtering. Note that the barrier film has a function of preventing Cu in the after-mentioned interconnection from diffusing into the porous insulating film 38. Next, over the surface of the semiconductor substrate 10, a seed film (not illustrated) made of Cu (having a thickness of 10 nm) was formed by sputtering. Note that when an interconnection made of Cu is formed by electroplating, the seed film functions as an electrode. In this way, a laminate film 48 composed of a barrier film and seed film was formed (FIG. 2G).

Next, a Cu film 50 having a thickness of 600 nm was formed by electroplating.

Further, the Cu film 50 and the laminate film 48 were polished by chemical mechanical polishing (CMP) until the surface of the interlayer insulating film 40 was exposed. As a result, an interconnection 50 made of Cu was embedded in the groove 46. The above-mentioned production process of the interconnection 50 is a technique called single damascene method.

Figure 2G:
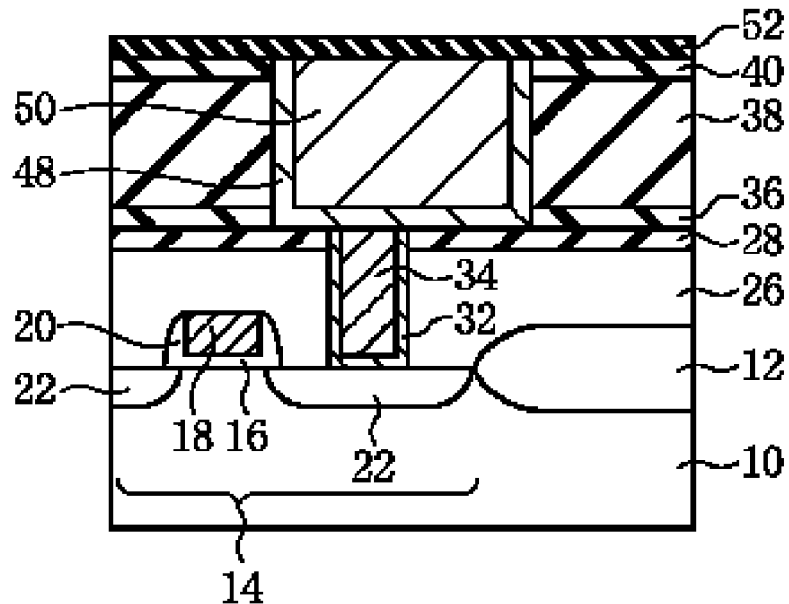
FIG. 2G exemplarily illustrates still yet another step of a method for producing a semiconductor device according to the embodiment (seventh).

Subsequently, the first insulating film forming material (coating liquid) was spin-coated over the surface of the substrate 10 and then pre-baked at 200° C. to volatilize the solvents contained in the coating liquid, thereby forming an interlayer insulating film 52 (having a thickness of 50 nm) made of polycarbosilane (FIG. 2G).

Thereafter, a coating liquid containing 1% by mass of vinyltriacetoxysilane (SILA-ACE S200, produced by Chisso Corporation) was spin-coated over the interlayer insulating film 52 and then pre-baked at 100° C. to volatilize solvents contained in the coating liquid, thereby forming an adhesion enhancing layer (not illustrated) (adhesion enhancing layer forming treatment).

Figure 2H:
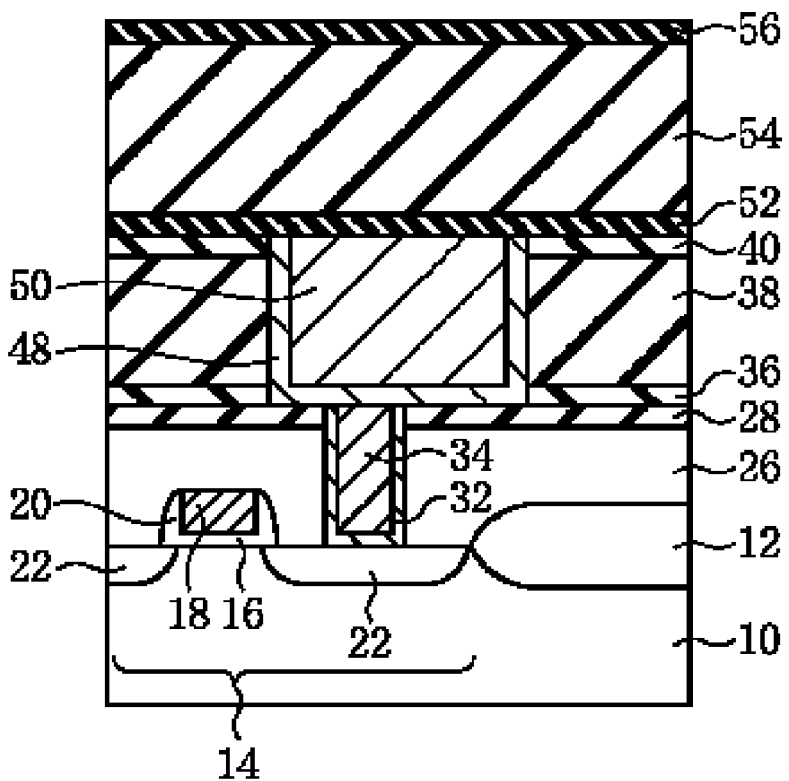
FIG. 2H exemplarily illustrates still yet another step of a method for producing a semiconductor device according to the embodiment (eighth).

Next, as illustrated in FIG. 2H, a porous insulating film 54 made of a porous silica (having a thickness of 180 nm) was formed over the adhesion enhancing layer. Subsequently, an ultraviolet ray (active energy beam) was irradiated to the porous insulating film 54 at an illumination intensity of 250 mW/cm$^2$ (measured by UVD-S254, Ushio Inc.) for 10 minutes to thereby combine the interlayer insulating film 52 and the porous insulating film 54. Note that the irradiation of ultraviolet ray was carried out under the same conditions as used in the irradiation of the porous insulating film 38.

Next, the first insulating film forming material (coating liquid) was spin-coated over the surface of the substrate 10 having the porous insulating film 54 formed thereon, and then pre-baked at 200° C. to volatilize the solvents contained in the coating liquid, thereby forming an interlayer insulating film 56 (having a thickness of 50 nm) made of polycarbosilane.

Thereafter, a coating liquid containing 1% by mass of vinyltriacetoxysilane (SILA-ACE S200, produced by Chisso Corporation) was spin-coated over the interlayer insulating film 56 and then pre-baked at 100° C. to volatilize solvents contained in the coating liquid, thereby forming an adhesion enhancing layer (not illustrated) (adhesion enhancing layer forming treatment).

Figure 2I:
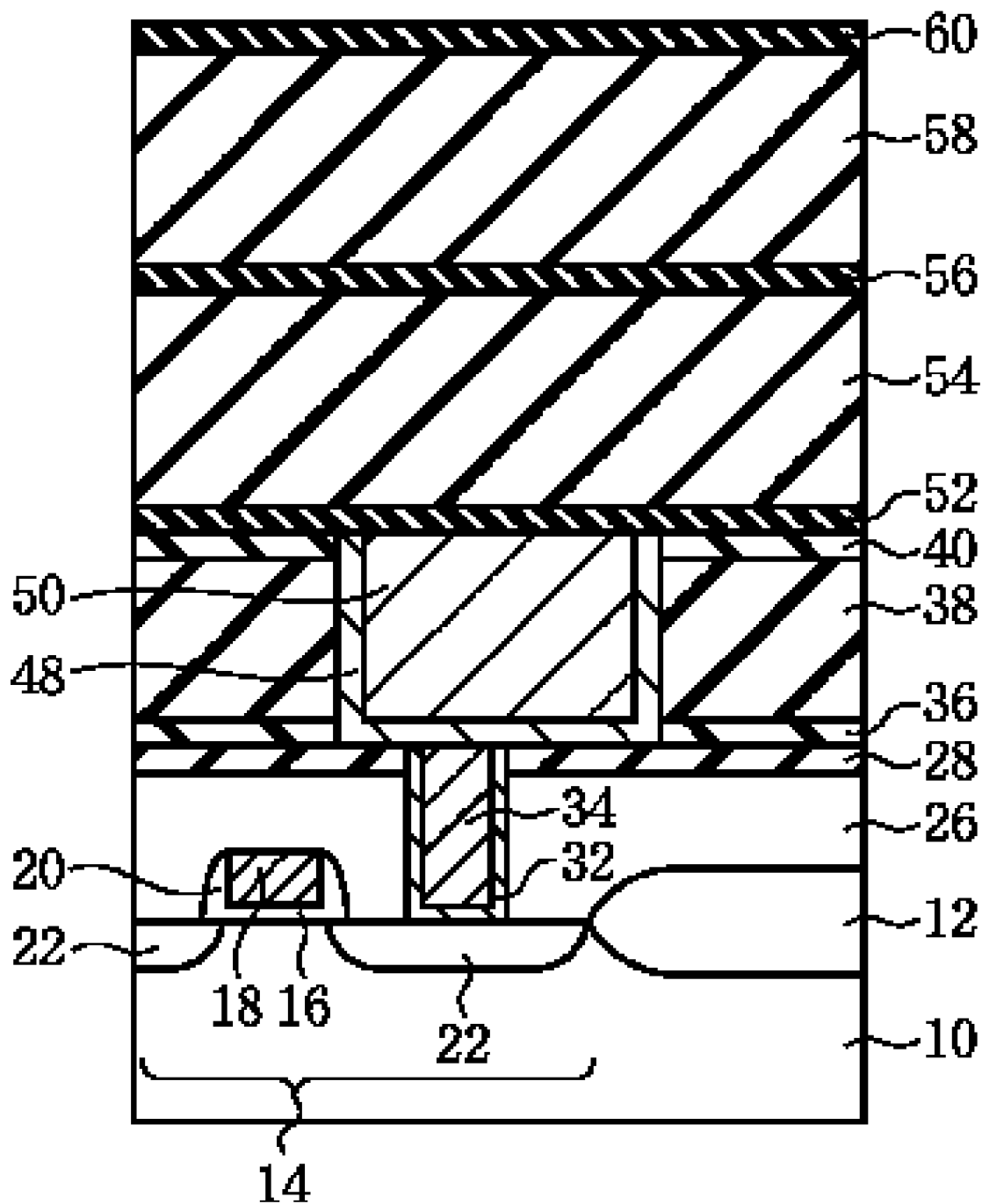
FIG. 2I exemplarily illustrates still yet another step of a method for producing a semiconductor device according to the embodiment (ninth).

Next, as illustrated in FIG. 2I, a porous insulating film 58 made of a porous silica (having a thickness of 160 nm) was formed in the same manner as used for forming the porous insulating film 38. Then, an ultraviolet ray (active energy beam) was irradiated to the porous insulating film 58 at an illumination intensity of 250 mW/cm$^2$ (measured by UVD-S254, Ushio Inc.) for 10 minutes to thereby combine the interlayer insulating film 56 and the porous insulating film 58. Note that the irradiation of ultraviolet ray was carried out under the same conditions as used in the irradiation of the porous insulating film 38. Subsequently, over the porous insulating film 58, an interlayer insulating film 60 having a thickness of 30 nm was formed by a CVD method.

Figure 2J:
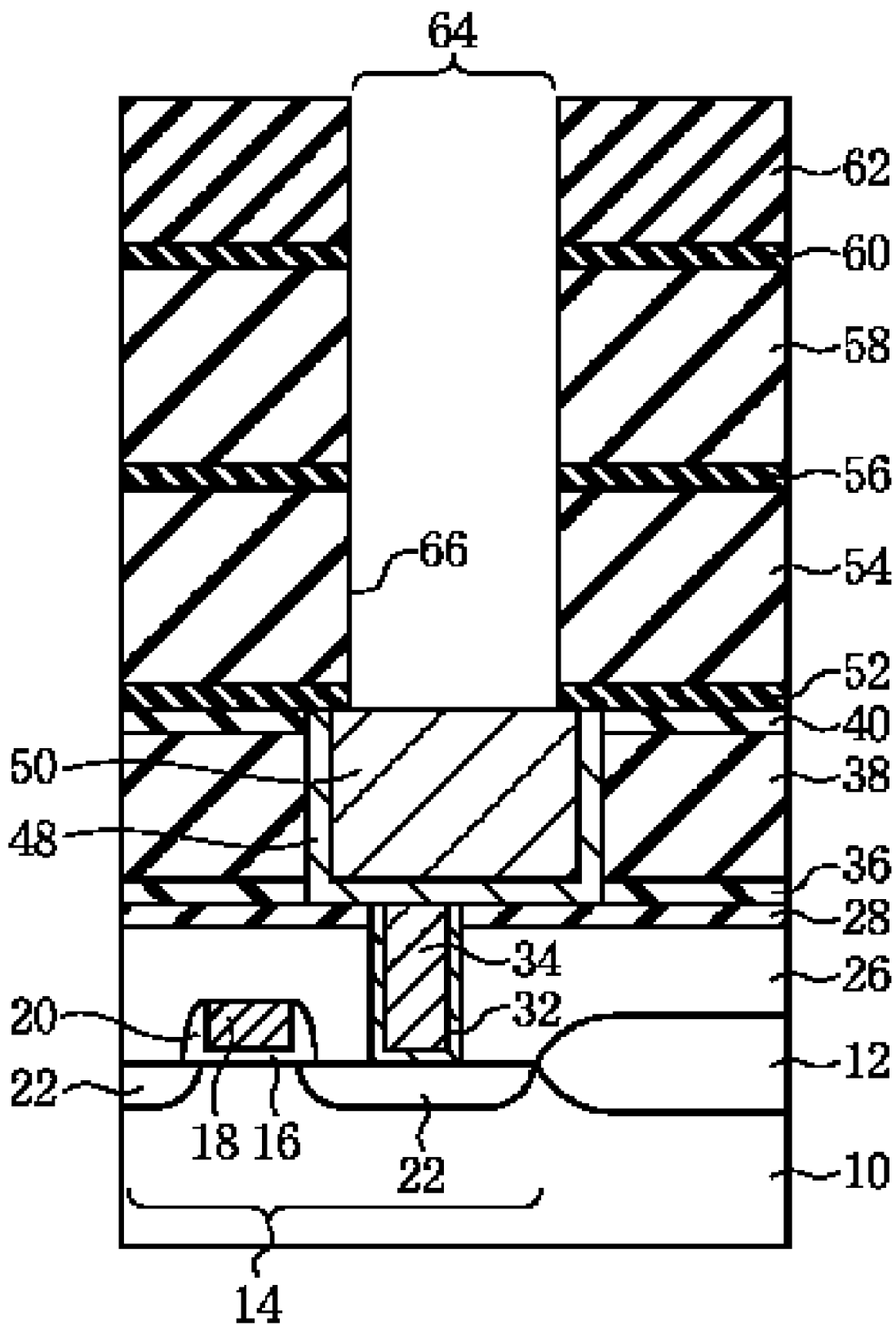
FIG. 2J exemplarily illustrates still yet another step of a method for producing a semiconductor device according to the embodiment (tenth).

Next, as illustrated in FIG. 2J, a photoresist film 62 was formed over the interlayer insulating film 60 by spin-coating. Then, an opening 64 was formed in the photoresist film 62 by photolithography. Here, the opening 64 is formed for forming a contact hole 66 reaching the first interconnection (first metal interconnection layer) 50. Then, the interlayer insulating film 60, porous insulating film 58, interlayer insulating film 56, porous insulating film 54 and interlayer insulating film 52 were subjected to etching treatment using the photoresist film 62 as a mask. Note that the etching treatment was carried out using a fluorine plasma containing $CF_4$ gas and $CHF_3$ gas as starting materials while appropriately varying a composition ratio of the gases and a pressure applied in the etching treatment. In this way, the contact hole 66 reaching the interconnection 50 was formed. Thereafter, the photoresist film 62 was stripped away from the workpiece.

Figure 2K:
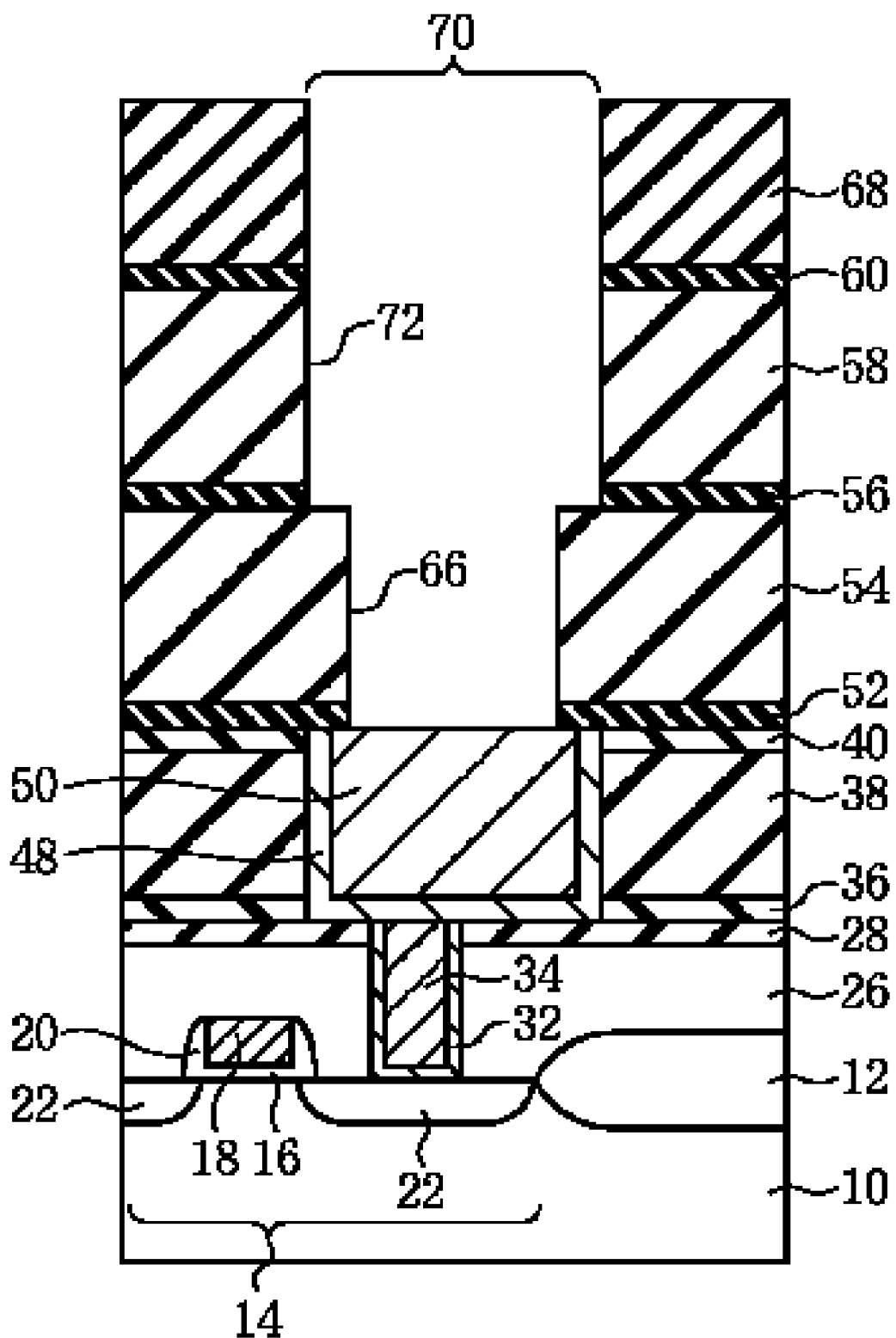
FIG. 2K exemplarily illustrates still yet another step of a method for producing a semiconductor device according to the embodiment (eleventh).
Figure 2L:
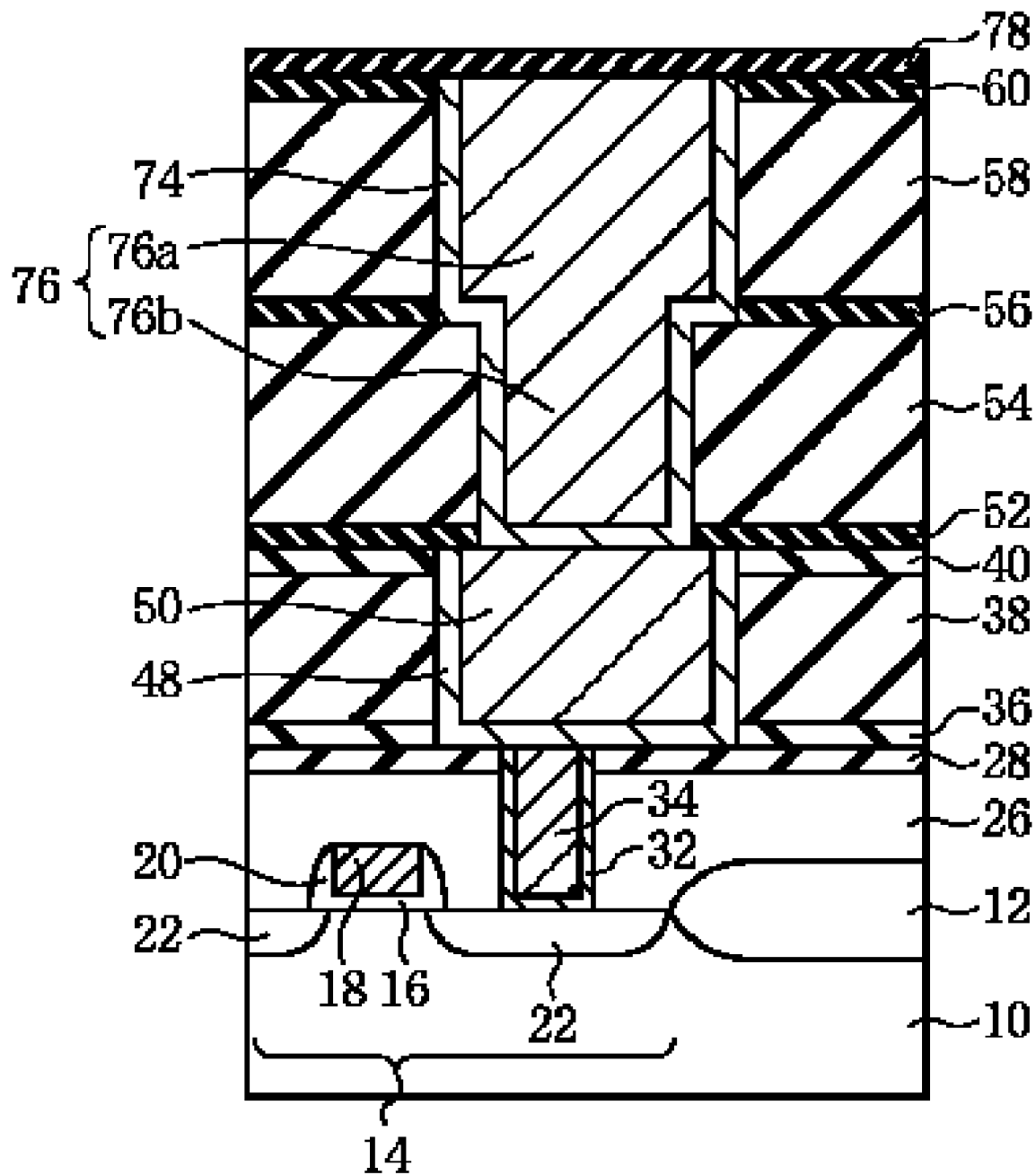
FIG. 2L exemplarily illustrates still yet another step of a method for producing a semiconductor device according to the embodiment (twelfth).

Next, as illustrated in FIG. 2K, a photoresist film 68 was formed over the interlayer insulating film 60 by spin-coating. Then, an opening 70 was formed in the photoresist film 68 by photolithography. Here, the opening 70 is formed for forming a second interconnection (second metal interconnection layer) 76a (see FIG. 2L).

Next, the interlayer insulating film 60, porous insulating film 58, interlayer insulating film 56 were subjected to etching treatment using the photoresist film 68 as a mask. Note that the etching treatment was carried out using a fluorine plasma containing $CF_4$ gas and $CHF_3$ gas as starting materials. In this way, a groove 72 for embedding the interconnection 76a in the interlayer insulating film 60, porous insulating film 58 and interlayer insulating film 56 was formed. The groove 72 was connected to the contact hole 66.

Next, over the surface of the semiconductor substrate 10, a barrier film (not illustrated) made of TaN (having a thickness of 10 nm) was formed by sputtering. Note that the barrier film has a function of preventing Cu in the interconnection 76a and the after-mentioned conductive plug 76b from diffusing into the porous insulating films 54 and 58. Next, over the surface of the semiconductor substrate 10, a seed film (not illustrated) made of Cu (having a thickness of 10 nm) was formed by sputtering. Note that when the interconnection 76a and the conductive plug 76b each made of Cu are formed by electroplating, the seed film functions as an electrode. In this way, a laminate film 74 composed of a barrier film and seed film was formed.

Next, a Cu film 76 having a thickness of 1,400 nm was formed by electroplating.

Further, the Cu film 76 and the laminate film 74 were polished by chemical mechanical polishing (CMP) until the surface of the interlayer insulating film 60 was exposed. As a result, the conductive plug 76*b* made of Cu was embedded in the contact hole 66, and the interconnection 76*a* made of Cu was embedded in the groove 72. Note that the conductive plug 76*b* and the interconnection 76*a* were integrally formed. The production process of forming the conductive plug 76*b* and the interconnection 76*a* at a time is a technique called dual damascene method.

Next, over the surface of the semiconductor substrate 10, an interlayer insulating film 78 (having a thickness of 30 nm) was formed by a CVD method.

Thereafter, the above-mentioned procedure was repeated appropriate times to form a not illustrated third interconnection (third metal interconnection layer), thereby producing a semiconductor device.

According to the above-mentioned procedure, interconnections and conductive plugs were formed so that 1,000,000 pieces of conductive plugs could be electrically series-connected, and the yield was measured and found to be 100%.

<Measurement of Si-CxHy-Si bond in Adhesion enhancing layer and Second Insulating Film> A proportion (A) of Si-CxHy-Si bond contained in the adhesion enhancing layer and a proportion (B) of Si-CxHy-Si bond contained in the second insulating film were measured as follows. Specifically, Si 2p spectrum was obtained by XPS (X-ray Photoelectron Spectroscopy), and the spectrum was subjected to waveform separation. Thereafter, a ratio (A/B) of the proportion (A) to the proportion (B) was obtained by calculation. The results are shown in Table 1.

<Evaluation method of Adhesion (Number of Ruptured Films and Adhesion Strength)> The adhesion between the first and second insulating films was evaluated as follows. Ten samples each having a first insulating film and a second insulating film formed on a silicon substrate and having an adhesion enhancing layer formed at the interface between the first and second insulating films were produced. Tensile strength test was carried out on the samples using a Stud-pull tester (Sebastian Five, Quad Group). Then, the adhesion was evaluated based on the number of samples in which film rupture was observed (the number of ruptured films). The results are shown in Table 1. In addition, tensile strength measurement values of the samples, in which film rupture was observed, were averaged out. The calculated average value was given as the adhesion strength. The results are shown in Table 1. Note that a sample, in which no film rupture was observed, was determined to have an adhesion strength higher than 600 ($kg/cm^2$), because the upper limit measurement value of the tensile strength test is 600 ($kg/cm^2$).

EXAMPLE 2

The production of a multilayer interconnection and a semiconductor device, the measurement of Si-CxHy-Si bond in the adhesion enhancing layer and second insulating film, and the evaluation of adhesion (the number of ruptured films and an adhesion strength) were repeated in the same manner as in Example 1, except that an electron beam having an acceleration voltage of 2.5 keV was used as an active energy beam instead of irradiating the ultraviolet ray. The results are shown in Table 1.

EXAMPLE 3

The production of a multilayer interconnection and a semiconductor device, the measurement of Si-CxHy-Si bond in the adhesion enhancing layer and second insulating film, and the evaluation of adhesion (the number of ruptured films and an adhesion strength) were repeated in the same manner as in Example 1, except that vinyltris(methoxyethoxy)silane was used instead of vinyltriacetoxysilane contained in the adhesion-enhancing-layer-forming coating liquid. The results are shown in Table 1.

EXAMPLE 4

The production of a multilayer interconnection and a semiconductor device, the measurement of Si-CxHy-Si bond in the adhesion enhancing layer and second insulating film, and the evaluation of adhesion (the number of ruptured films and an adhesion strength) were repeated in the same manner as in Example 3, except that an electron beam having an acceleration voltage of 2.5 keV was used as an active energy beam instead of irradiating the ultraviolet ray. The results are shown in Table 1.

EXAMPLE 5

The production of a multilayer interconnection and a semiconductor device, the measurement of Si-CxHy-Si bond in the adhesion enhancing layer and second insulating film, and the evaluation of adhesion (the number of ruptured films and an adhesion strength) were repeated in the same manner as in Example 1, except that vinyltrimethoxysilane was used instead of vinyltriacetoxysilane contained in the adhesion-enhancing-layer-forming coating liquid. The results are shown in Table 1.

EXAMPLE 6

The production of a multilayer interconnection and a semiconductor device, the measurement of Si-CxHy-Si bond in the adhesion enhancing layer and second insulating film, and the evaluation of adhesion (the number of ruptured films and an adhesion strength) were repeated in the same manner as in Example 5, except that an electron beam having an acceleration voltage of 2.5 keV was used as an active energy beam instead of irradiating the ultraviolet ray. The results are shown in Table 1.

EXAMPLE 7

The production of a multilayer interconnection and a semiconductor device, the measurement of Si-CxHy-Si bond in the adhesion enhancing layer and second insulating film, and the evaluation of adhesion (the number of ruptured films and an adhesion strength) were repeated in the same manner as in Example 1, except that 3-phenylaminopropyltrimethoxysilane was used instead of vinyltriacetoxysilane contained in the adhesion-enhancing-layer-forming coating liquid. The results are shown in Table 1.

EXAMPLE 8

The production of a multilayer interconnection and a semiconductor device, the measurement of Si-CxHy-Si bond in the adhesion enhancing layer and second insulating film, and the evaluation of adhesion (the number of ruptured films and an adhesion strength) were repeated in the same manner as in Example 7, except that an electron beam having an acceleration voltage of 2.5 keV was used as an active energy beam instead of irradiating the ultraviolet ray. The results are shown in Table 1.

EXAMPLE 9

The production of a multilayer interconnection and a semiconductor device, the measurement of Si-CxHy-Si bond in the adhesion enhancing layer and second insulating film, and the evaluation of adhesion (the number of ruptured films and an adhesion strength) were repeated in the same manner as in Example 1, except that a mixture (Z-6032, produced by TORAY Dow Corning Co. Ltd.) of 1,2-ethanediamine, N-{3-(trimethoxysilyl)propyl} and N-{(ethenylphenyl)methyl} was used instead of vinyltriacetoxysilane contained in the adhesion-enhancing-layer-forming coating liquid. The results are shown in Table 1.

EXAMPLE 10

The production of a multilayer interconnection and a semiconductor device, the measurement of Si-CxHy-Si bond in the adhesion enhancing layer and second insulating film, and the evaluation of adhesion (the number of ruptured films and an adhesion strength) were repeated in the same manner as in Example 9, except that an electron beam having an acceleration voltage of 2.5 keV was used as an active energy beam instead of irradiating the ultraviolet ray. The results are shown in Table 1.

COMPARATIVE EXAMPLE 1

The production of a multilayer interconnection and a semiconductor device, the measurement of Si-CxHy-Si bond in the adhesion enhancing layer and second insulating film, and the evaluation of adhesion (the number of ruptured films and an adhesion strength) were repeated in the same manner as in Example 1, except that "adhesion enhancing layer forming treatment" and "irradiation of an active energy beam (ultraviolet ray)" were not carried out. The results are shown in Table 1.

COMPARATIVE EXAMPLE 2

The production of a multilayer interconnection and a semiconductor device, the measurement of Si-CxHy-Si bond in the adhesion enhancing layer and second insulating film, and the evaluation of adhesion (the number of ruptured films and an adhesion strength) were repeated in the same manner as in Example 1, except that "adhesion enhancing layer forming treatment" was not carried out. The results are shown in Table 1.

COMPARATIVE EXAMPLE 3

The production of a multilayer interconnection and a semiconductor device, the measurement of Si-CxHy-Si bond in the adhesion enhancing layer and second insulating film, and the evaluation of adhesion (the number of ruptured films and an adhesion strength) were repeated in the same manner as in Example 2, except that "adhesion enhancing layer forming treatment" was not carried out. The results are shown in Table 1.

TABLE 1

| | Adhesion enhancing layer | Active energy beam | A/B | The number of ruptured films | Adhesion strength (kg/cm2) | Yield |
|---|---|---|---|---|---|---|
| Comp. Ex. 1 | Not used | Not used | — | 10 | 412 | 51.1 |
| Comp. Ex. 2 | Not used | ultraviolet ray | — | 9 | 465 | 57.6 |
| Comp. Ex. 3 | Not used | electron beam | — | 10 | 458 | 51.1 |
| Ex. 1 | Vinyltriacetoxysilane | ultraviolet ray | 1.6 | 0 | higher than 600 | 100 |
| Ex. 2 | Vinyltriacetoxysilane | electron beam | 1.5 | 0 | higher than 600 | 96.1 |
| Ex. 3 | Vinyltris(methoxyethoxy)silane | ultraviolet ray | 1.7 | 0 | higher than 600 | 100 |
| Ex. 4 | Vinyltris(methoxyethoxy)silane | electron beam | 1.8 | 0 | higher than 600 | 96.1 |
| Ex. 5 | Vinyltrimethoxysilane | ultraviolet ray | 1.3 | 0 | higher than 600 | 94.7 |
| Ex. 6 | Vinyltrimethoxysilane | electron beam | 1.5 | 0 | higher than 600 | 96.1 |
| Ex. 7 | 3-phenylaminopropyl-trimethoxysilane | ultraviolet ray | 1.7 | 0 | higher than 600 | 96.1 |
| Ex. 8 | 3-phenylaminopropyl-trimethoxysilane | electron beam | 1.5 | 0 | higher than 600 | 94.7 |
| Ex. 9 | Mixture of 1,2-ethanediamine, N-{3-(trimethoxysilyl)propyl}, and N-{(ethenylphenyl)methyl)} | ultraviolet ray | 1.3 | 0 | higher than 600 | 199 |
| Ex. 10 | Mixture of 1,2-ethanediamine, N-{3-(trimethoxysilyl)propyl}, and N-{(ethenylphenyl)methyl)} | electron beam | 1.2 | 0 | higher than 600 | 94.7 |

The results shown in Table 1 demonstrated that Examples 1 to 10 had improvements in yield and adhesion strength as compared with Comparative Examples 1 to 3. Therefore, according to the present embodiment, it is possible to increase the adhesion between insulating films and to increase the yield in a process of forming a multilayer interconnection for semiconductor device and the reliability.

What is claimed is:
1. An interconnection substrate comprising:
    a first insulating film made of a silicon compound,
    an adhesion enhancing layer of a material containing organoalkoxysilane formed on the first insulating film, and
    a second insulting film made of a silicon compound and formed on the adhesion enhancing layer of a material containing organoalkoxysilane, wherein the first insulating film and the second insulating film are combined together with a component having a structure represented by General Formula (1) described below:

$$\text{Si—C}_X\text{H}_Y\text{—Si} \qquad \text{General Formula (1)}$$

where y is equal to 2x and is an even integer.

2. The interconnection substrate according to claim 1, wherein a material forming the adhesion enhancing layer contains organoalkoxysilane reactive with an active energy beam.

3. The interconnection substrate according to claim 2, wherein the active energy beam is at least one selected from the group consisting of infrared ray, visible light, ultraviolet ray, electron beam and X-ray.

4. The interconnection substrate according to claim 1, wherein a material forming the adhesion enhancing layer contains a basic additive and organoalkoxysilane.

5. The interconnection substrate according to claim 1, wherein the adhesion enhancing layer contains the component having a structure represented by General Formula (1) in an amount more than contained in the second insulating film.

6. A semiconductor device comprising,
a multilayer interconnection,
wherein the multilayer interconnection comprises a first insulating film made of a silicon compound, an adhesion enhancing layer of a material containing organoalkoxysilane provided on the first insulating film, and a second insulting film made of a silicon compound and provided on the adhesion enhancing layer, and
wherein the first insulating film and the second insulating film are combined together with a component having a structure represented by General Formula (1) described below:

$$\text{Si—C}_X\text{H}_Y\text{—Si} \qquad \text{General Formula (1)}$$

where y is equal to 2x and is an even integer.

7. The semiconductor device according to claim 6, wherein a material forming the adhesion enhancing layer contains organoalkoxysilane reactive with an active energy beam.

8. The semiconductor device according to claim 7, wherein the active energy beam is at least one selected from the group consisting of infrared ray, visible light, ultraviolet ray, electron beam and X-ray.

9. The semiconductor device according to claim 6, wherein a material forming the adhesion enhancing layer contains a basic additive and organoalkoxysilane.

10. The semiconductor device according to claim 6, wherein the adhesion enhancing layer contains the component having a structure represented by General Formula (1) in an amount more than contained in the second insulating film.

\* \* \* \* \*